(12) United States Patent
Yen et al.

(10) Patent No.: US 8,912,021 B2
(45) Date of Patent: Dec. 16, 2014

(54) SYSTEM AND METHOD FOR FABRICATING LIGHT EMITTING DIODE (LED) DICE WITH WAVELENGTH CONVERSION LAYERS

(75) Inventors: Jui-Kang Yen, Zhubei (TW); De-Shuo Chen, New Taipei (TW)

(73) Assignee: SemiLEDS Optoelectronics Co., Ltd., Chu-nan (TW)

( * ) Notice: Subject to any disclaimer, the term of this patent is extended or adjusted under 35 U.S.C. 154(b) by 272 days.

(21) Appl. No.: 13/473,796

(22) Filed: May 17, 2012

(65) Prior Publication Data

US 2013/0062646 A1    Mar. 14, 2013

Related U.S. Application Data

(63) Continuation-in-part of application No. 13/229,824, filed on Sep. 12, 2011.

(51) Int. Cl.
*H01L 21/00* (2006.01)
*H01L 33/00* (2010.01)
*H01L 33/50* (2010.01)

(52) U.S. Cl.
CPC ....... *H01L 33/505* (2013.01); *H01L 2933/0041* (2013.01)
USPC .................. 438/29; 257/98; 257/E33.061

(58) Field of Classification Search
None
See application file for complete search history.

(56) References Cited

U.S. PATENT DOCUMENTS

| | | | |
|---|---|---|---|
| 5,998,925 A | 12/1999 | Shimizu et al. | |
| 6,351,069 B1 | 2/2002 | Lowery et al. | |
| 6,504,181 B2 | 1/2003 | Furukawa et al. | |
| 6,576,488 B2 | 6/2003 | Collins, III et al. | |
| 6,589,809 B1 | 7/2003 | Koopmans | |
| 6,642,652 B2 | 11/2003 | Collins, III et al. | |
| 6,744,196 B1 | 6/2004 | Jeon | |
| 7,045,956 B2 | 5/2006 | Braune et al. | |
| 7,195,944 B2 | 3/2007 | Tran et al. | |
| 7,361,938 B2 | 4/2008 | Mueller et al. | |
| 7,432,119 B2 | 10/2008 | Doan | |
| 7,615,789 B2 | 11/2009 | Tran | |
| 7,646,033 B2 | 1/2010 | Tran et al. | |

(Continued)

FOREIGN PATENT DOCUMENTS

WO    WO 2004040661    5/2004

OTHER PUBLICATIONS

Edward D. Cohen, "Choosing the Coating Method", Modern Coating and Drying Technology, date unavailable, pp. 1-20.

(Continued)

*Primary Examiner* — Daniel Luke
(74) *Attorney, Agent, or Firm* — Stephen A. Gratton

(57) ABSTRACT

A system for fabricating light emitting diode (LED) dice includes a wavelength conversion layer contained on a substrate on an adhesive layer configured to have reduced adhesiveness upon exposure to a physical energy, such as electromagnetic radiation or heat. The system also includes a curing apparatus configured to reduce the adhesiveness of the adhesive layer to facilitate removal of the wavelength conversion layer from the substrate, and an attachment apparatus configured to remove the wavelength conversion layer from the substrate and to attach the wavelength conversion layer to a light emitting diode (LED) die. A method for fabricating light emitting diode (LED) dice includes the steps of exposing the adhesive layer on the substrate to the physical energy to reduce the adhesiveness of the adhesive layer, removing the wavelength conversion layer from the substrate, and attaching the wavelength conversion layer to the light emitting diode (LED) die.

14 Claims, 5 Drawing Sheets

(56) References Cited

U.S. PATENT DOCUMENTS

| | | |
|---|---|---|
| 7,737,459 B2 | 6/2010 | Edmond et al. |
| 7,781,783 B2 | 8/2010 | Yen et al. |
| 7,824,941 B2 | 11/2010 | Braune et al. |
| 8,012,774 B2 | 9/2011 | Tran et al. |
| 2002/0076904 A1 | 6/2002 | Imler |
| 2002/0089058 A1 | 7/2002 | Hedler et al. |
| 2002/0185965 A1 | 12/2002 | Collins et al. |
| 2004/0077114 A1 | 4/2004 | Coman et al. |
| 2004/0245543 A1 | 12/2004 | Yoo |
| 2005/0173692 A1 | 8/2005 | Park et al. |
| 2006/0003477 A1 | 1/2006 | Braune et al. |
| 2006/0057753 A1* | 3/2006 | Schardt et al. ............... 438/34 |
| 2006/0061259 A1 | 3/2006 | Negley |
| 2007/0267646 A1 | 11/2007 | Wierer, Jr. et al. |
| 2009/0273918 A1 | 11/2009 | Falicoff et al. |
| 2010/0165599 A1 | 7/2010 | Allen |
| 2010/0308361 A1* | 12/2010 | Beeson et al. ............... 257/98 |
| 2012/0028388 A1* | 2/2012 | Katayama ..................... 438/27 |

OTHER PUBLICATIONS

Nitto Denko Revalpha Thermal Release Tape, Semiconductor Equipment Corp., Moorpark, CA, advertising page, available at www.Semicorp.com, date unavailable, one sheet.

U.S. Appl. No. 13/229,824, filed Sep. 12, 2011, titled "Method for Fabricating Light Emitting Diode (LED) Devices Having Output With Selected Characteristics", pgs.

* cited by examiner

US 8,912,021 B2

SYSTEM AND METHOD FOR FABRICATING LIGHT EMITTING DIODE (LED) DICE WITH WAVELENGTH CONVERSION LAYERS

CROSS REFERENCE TO RELATED APPLICATIONS

This application is a continuation-in-part of Ser. No. 13/229,824 filed Sep. 12, 2011, which is incorporated herein by reference.

BACKGROUND

This disclosure relates generally to light emitting diodes (LED) dice and more particularly to light emitting diode (LED) dice having wavelength conversion layer and to a system and method for fabricating light emitting diode (LED) dice with the wavelength conversion layers.

Light emitting diode (LED) dice have been developed that produce white light. In order to produce white light, a blue (LED) die can be used in combination with a wavelength conversion layer, such as a phosphor layer formed on the surface of the die. The electromagnetic radiation emitted by the blue (LED) die excites the atoms of the wavelength conversion layer, which converts some of the electromagnetic radiation in the blue wavelength spectral region to the yellow wavelength spectral region. The ratio of the blue to the yellow can be manipulated by the composition and geometry of the wavelength conversion layer, such that the output of the light emitting diode (LED) die appears to be white light.

One method for forming the wavelength conversion layer in a light emitting diode (LED) die is to fabricate the wavelength conversion layer as a separate member, which is then attached to the die. For example, the wavelength conversion layer can be in the form of a piece of tape having a phosphor compound thereon, which is placed on an adhesive layer deposited on the light emitting diode (LED) die. Typically, the wavelength conversion layer is initially fabricated on a substrate and is removed from the substrate and attached to the die using a capillary device attached to a vacuum supply.

Referring to FIG. 1, a prior art system for handling wavelength conversion layers includes a plurality of wavelength conversion layers 10 contained on a substrate 12 with an adhesive tape 14 attaching the wavelength conversion layers 10 to the substrate 12. For removing the wavelength conversion layers 10 from the substrate 12, a capillary device 16 can be used in combination with an ejection pin 16. However, due to the adhesiveness of the tape 14, removal of the wavelength conversion layers 10 from the substrate 12 requires a large force. As illustrated in FIG. 2, this can cause cracks 20 or other damage to the wavelength conversion layers 10, which can vary the color composite of the white light produced by a light emitting diode (LED) die.

It is difficult to fabricate a white light emitting diode (LED) die with consistent color balance because any damage to the wavelength conversion layer during the fabrication process can change the output of the die. The present disclosure is directed to a system and method for fabricating light emitting diode (LED) dice in which damage to the wavelength conversion layers is minimized.

SUMMARY

A system for fabricating light emitting diode (LED) dice includes a light emitting diode (LED) die and a wavelength conversion layer configured for attachment to the die contained on a substrate on an energy sensitive adhesive layer configured to have reduced adhesiveness upon exposure to a physical energy such as an electromagnetic radiation or heat. The system also includes a curing apparatus configured to reduce the adhesiveness of the adhesive layer to facilitate removal of the wavelength conversion layer from the substrate, and an attachment apparatus configured to remove the wavelength conversion layer from the substrate and to attach the wavelength conversion layer to the light emitting diode (LED) die.

A method for fabricating light emitting diode (LED) dice includes the steps of providing a light emitting diode (LED) die having a desired configuration, and providing a wavelength conversion layer contained on a substrate on an energy sensitive adhesive layer configured to have reduced adhesiveness upon exposure to a physical energy. The method also includes the steps of exposing the adhesive layer on the substrate to the physical energy to reduce the adhesiveness of the adhesive layer and facilitate removal of the wavelength conversion layer from the substrate, removing the wavelength conversion layer from the substrate, and attaching the wavelength conversion layer to the light emitting diode (LED) die.

DETAILED DESCRIPTION

It is to be understood that when an element is stated as being "on" another element, it can be directly on the other element or intervening elements can also be present. However, the term "directly" means there are no intervening elements. In addition, although the terms "first", "second" and "third" are used to describe various elements, these elements should not be limited by the term. Also, unless otherwise defined, all terms are intended to have the same meaning as commonly understood by one of ordinary skill in the art.

Figure 3:
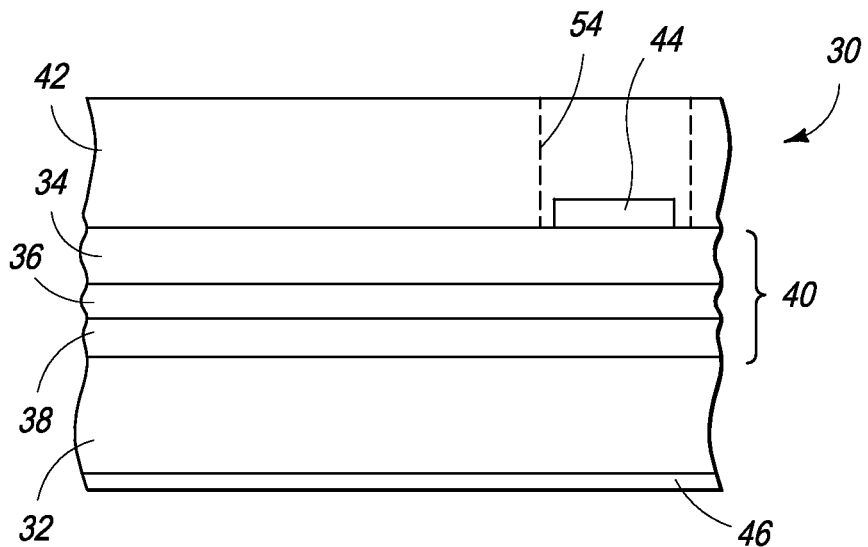
FIG. 3 is a schematic cross sectional view of a light emitting diode (LED) die having a wavelength conversion layer.

Referring to FIG. 3, a light emitting diode (LED) die 30 is illustrated. The light emitting diode (LED) die 30 is in the form of a vertical light emitting diode (VLED). For simplicity various elements of the light emitting diode (LED) die 30 are not illustrated. However, this type of vertical light emitting diode (VLED) die is further described in U.S. Pat. No. 7,615,789, which is incorporated herein by reference. Although the light emitting diode (LED) die 30 is described as a vertical light emitting diode (VLED), it is to be understood that the concepts described herein can also be applied to other types of light emitting diode (LED) dice such as ones with planar electrode configurations.

The light emitting diode (LED) die 30 includes a conductive substrate 32, and an epitaxial stack 40 on the conductive substrate 32. The epitaxial stack 40 includes an n-type confinement layer 34, a multiple quantum well (MQW) layer 36 in electrical contact with the n-type confinement layer 34 configured to emit electromagnetic radiation, and a p-type confinement layer 38 in electrical contact with the multiple quantum well (MQW) layer 36.

The n-type confinement layer 34 preferably comprises n-GaN. Other suitable materials for the n-type confinement layer 34 include n-AlGaN, n-InGaN, n-AlInGaN, AlInN and n-AlN. The multiple quantum well (MQW) layer 36 preferably includes one or more quantum wells comprising one or more layers of InGaN/GaN, AlGaInN, AlGaN, AlInN and AN. The multiple quantum well (MQW) layer 36 can be configured to emit electromagnetic radiation from the visible spectral region (e.g., 400-770 nm), the violet-indigo spectral region (e.g., 400-450 nm), the blue spectral region (e.g., 450-490 nm), the green spectral region (e.g., 490-560 nm), the yellow spectral region (e.g., 560-590 nm), the orange spectral region (e.g., 590-635 nm) or the red spectral region (e.g., 635-700 nm). The p-type confinement layer 38 preferably comprises p-GaN. Other suitable materials for the p-type confinement layer 38 include p-AlGaN, p-InGaN, p-AlInGaN, p-AlInN and p-AlN.

Still referring to FIG. 3, the light emitting diode (LED) die 30 also includes an n-electrode 44 on the n-type confinement layer 34 and a p-electrode 46 on the backside of the conductive substrate 32. The n-electrode 44 and the p-electrode 46 can comprise a conductive material, such as a single layer of a metal such as W, Ti, Mo, Al, Cu, Ni, Ag, Au or Co, a metal alloy such as Cu—Co or Cu—Mo, or a metal stack such as Ni/Cu or Ni/Cu—Mo.

The light emitting diode (LED) die 30 also includes a wavelength conversion layer 42 formed on the epitaxial stack 40 in contact with the n-type confinement layer 34. The wavelength conversion layer 42 also includes an opening 54 aligned with the n-electrode 44 for providing access to the n-electrode 44. The wavelength conversion layer 42 is configured to convert at least some of the electromagnetic radiation emitted by the multiple quantum well (MQW) layer 36 into electromagnetic radiation having a different wavelength range, such as a higher wavelength range. For example, if the multiple quantum well (MQW) layer 36 emits electromagnetic radiation in a blue spectral range, the wavelength conversion layer 42 can be configured to convert at least some of this radiation to a yellow spectral range, such that the output of the light emitting diode (LED) die 30 appears to be white light.

Figure 1:
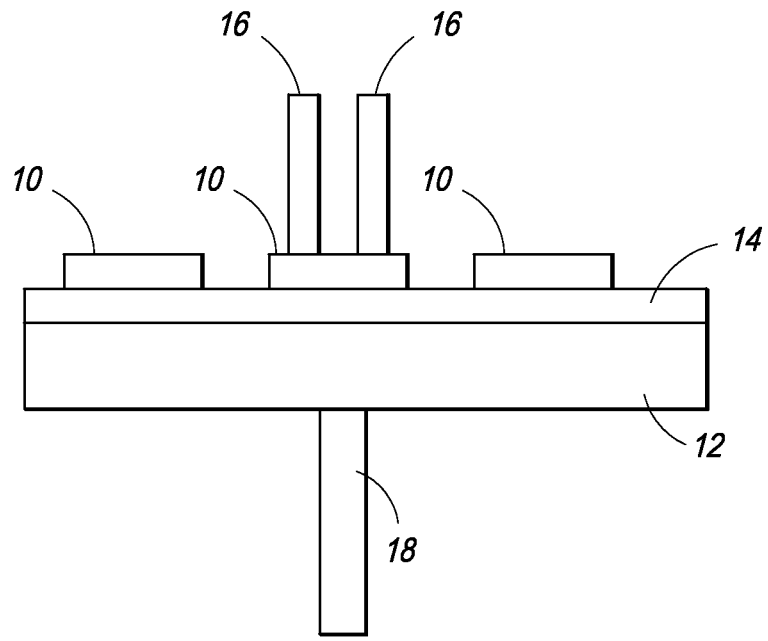
FIG. 1 is a schematic cross sectional view of a prior art system for handling wavelength conversion layers.
Figure 2:
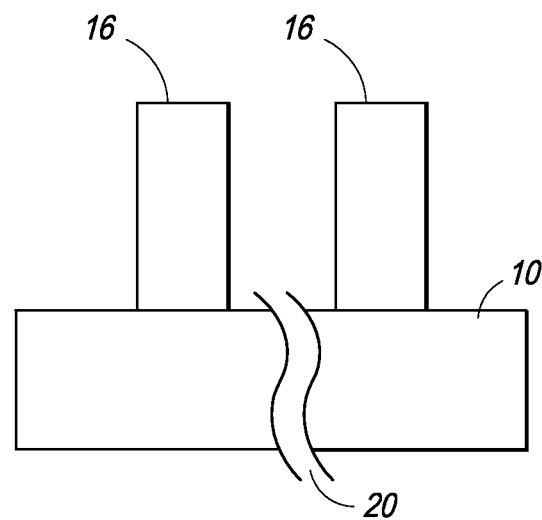
FIG. 2 is a schematic cross sectional view of a wavelength conversion layer during handling by the prior art wavelength conversion layer.
Figure 4:
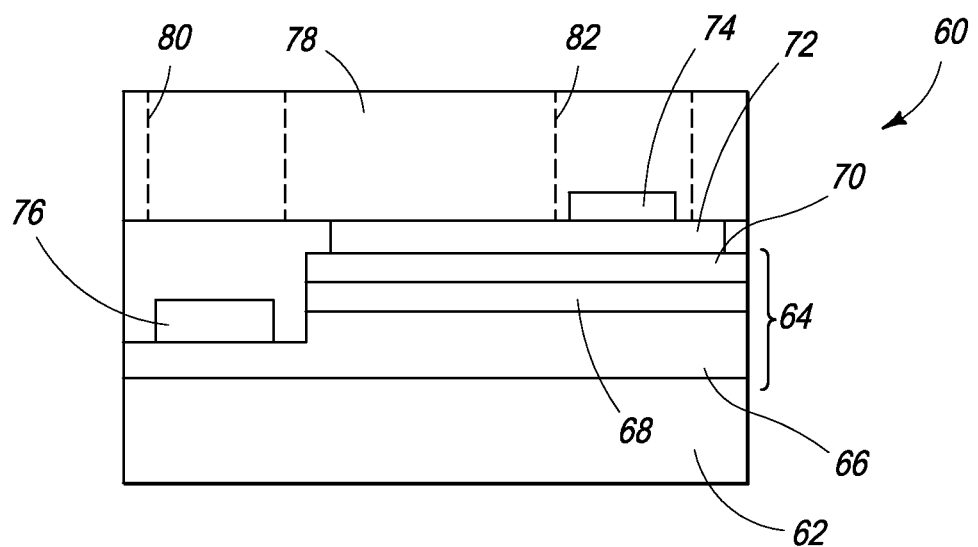
FIG. 4 is a schematic cross sectional view of a second light emitting diode (LED) die having a wavelength conversion layer.

Referring to FIG. 4, a planar light emitting diode (LED) die 60 is illustrated. The light emitting diode (LED) die 60 includes a transparent substrate 62, and an epitaxial stack 64 on the transparent substrate 62. The epitaxial stack 64 includes an n-type confinement layer 66, a multiple quantum well (MQW) layer 68 in electrical contact with the n-type confinement layer 66 configured to emit electromagnetic radiation, and a p-type confinement layer 70 in electrical contact with the multiple quantum well (MQW) layer 68. The planar light emitting diode (LED) die 60 also includes a transparent conductive layer 72 and a p-electrode 74 on the p-type confinement layer 70. The planar light emitting diode (LED) die 60 also includes an n-electrode 76 on the n-type confinement layer 66. The planar light emitting diode (LED) die 60 also includes a wavelength conversion layer 78 having a first opening 80 aligned with the n-electrode 76 and a second opening 82 aligned with the p-electrode 74. The wavelength conversion layer 78 can be configured substantially as previously described for wavelength conversion layer 42 (FIG. 2).

Figure 5:
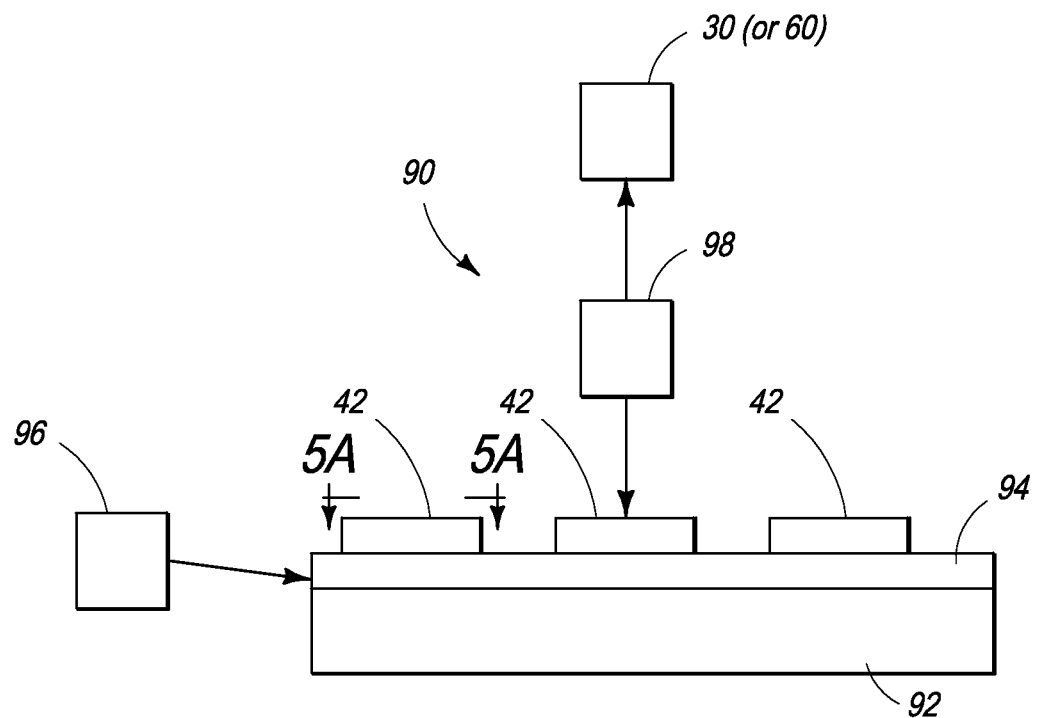
FIG. 5 is a schematic view of a system for fabricating light emitting diode (LED) dice with wavelength conversion layers.

Referring to FIG. 5, a system 90 for fabricating light emitting diode (LED) dice includes a light emitting diode (LED) die 30 (or 60) having a desired configuration, and a plurality of wavelength conversion layers 42 configured for attachment to the light emitting diode (LED) die 30 (or 60). The wavelength conversion layers 42 are contained on a substrate 92 on an energy sensitive adhesive layer 94 configured to have reduced adhesiveness upon exposure to a physical energy such as electromagnetic radiation, ultraviolet, infrared, radioactive or heat. The system 90 also includes a curing apparatus 96 configured to reduce the adhesiveness of the adhesive layer 94 to facilitate removal of the wavelength conversion layers 42 from the substrate 92. The system 90 also includes an attachment apparatus 98 configured to remove wavelength conversion layers 42 one by one from the substrate 92 and to attach each wavelength conversion layer 42 separately to the light emitting diode (LED) die 30 (or 60).

The substrate 92 can be in the form of a wafer or a panel having a desired size and shape. Suitable materials for the substrate 92 include plastic, metal, ceramic and semiconductor materials. The adhesive layer 94 can be formed directly on the surface of the substrate 92. For example, the adhesive layer 94 (FIG. 5) can comprise a tape or a deposited layer in which at least one adhesive surface thereof has a reduced adhesiveness when exposed to physical energy such as ultraviolet, infrared, radioactive or heat. Exemplary tapes include polymer films such as polyethylene, polypropylene, polyester, or polycarbonate, having an adhesive such as an acrylic polymer on one or both sides. One suitable tape is manufactured by Nitto Denko of Japan under the trademark REVALPHA thermal release tape, and is available in the United States through Semiconductor Equipment Corporation of Moorpark, Calif. 93020. Rather than being a tape, the adhesive layer 94 can comprise a deposited polymer having adhesive qualities, such as polyimide or epoxy in a cured or uncured condition.

Figure 5B:
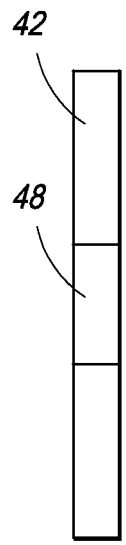
FIG. 5B is a schematic side elevation view of FIG. 5A.
Figure 5A:
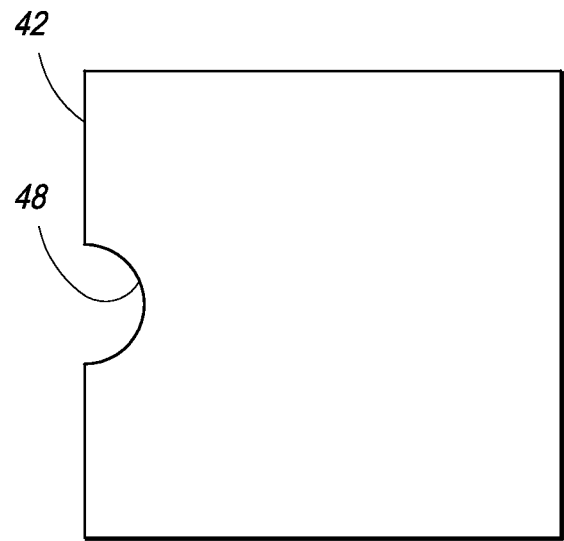
FIG. 5A is a schematic plan view taken along line 5A-5A of FIG. 5 illustrating a peripheral shape of a wavelength conversion layer of the system.

The wavelength conversion layers 42 (FIG. 5) can be formed directly on the adhesive layer 94 with required peripheral shapes and thicknesses using a suitable process such as deposition and patterning. For example, as shown in FIG. 5A, the wavelength conversion layer 42 has a polygonal peripheral shape which substantially matches the peripheral shape of the epitaxial stack 40 (FIG. 3) or 64 (FIG. 4) on the light emitting diode (LED) die 30 (FIG. 3) or 60 (FIG. 4). As shown in FIGS. 5A and 5B, the wavelength conversion layer 42 can also include one or more features 48 such as cut outs, openings and slots that correspond to the features on the light emitting diode (LED) die 30 (FIG. 3) or 60 (FIG. 4). For example, the features 48 can align with the n-electrode 44 (FIG. 3) on the light emitting diode (LED) die 30 (FIG. 3).

The wavelength conversion layers 42 can comprise a transparent base material such as plastic, glass, ceramic or an adhesive polymer, containing a wavelength conversion material, such as a phosphor compound. In this case, the wavelength conversion material can be incorporated into the base material, using a mixing process to form a viscous mixture, which can then be deposited on the adhesive layer 94 with a desired peripheral shape and thickness and cured into solid form. Exemplary base materials for the wavelength conversion layers 42 include silicone and epoxy in liquid or viscous form, which can be mixed with the wavelength conversion material in a specific ratio. Exemplary wavelength conversion materials include YAG:Ce, TAG:Ce, alkaline earth silicon nitride doped with Eu, alkaline earth silicate doped with Eu, or calcium scandate doped with Ce. Rather than being incorporated into the base material, the wavelength conversion material can be deposited on the base material. In this case, the base material can be deposited on the adhesive layer 94, and the wavelength conversion material can be deposited on the base material in a desired pattern using a suitable process such as spraying, dipping, spin coating, rolling, electro deposition or vapor deposition to a desired thickness.

The curing apparatus 96 (FIG. 5) can comprise an ultraviolet, infrared, thermal or radioactive source of radiation configured to apply energy with a required power to a selected area of the adhesive layer 94. For example, the curing apparatus 96 can be constructed such that the adhesive layer 94 can be locally cured in selected areas, such that each wavelength conversion layer can be individually removed. In addition, the curing apparatus 96 can be configured to cure the adhesive layer 94 in an area corresponding to the outline of an individual adhesive layer 94.

The attachment apparatus 98 (FIG. 5) can include a capillary device configured to pick the wavelength conversion layer 42 from the substrate 92 and to place the wavelength conversion layer 42 on the light emitting diode (LED) die 30 (or 60). The attachment mechanism 98 can also include a stepper mechanism, such as an x-y table, configured to align the substrate 92 with the capillary device.

Figure 6A:
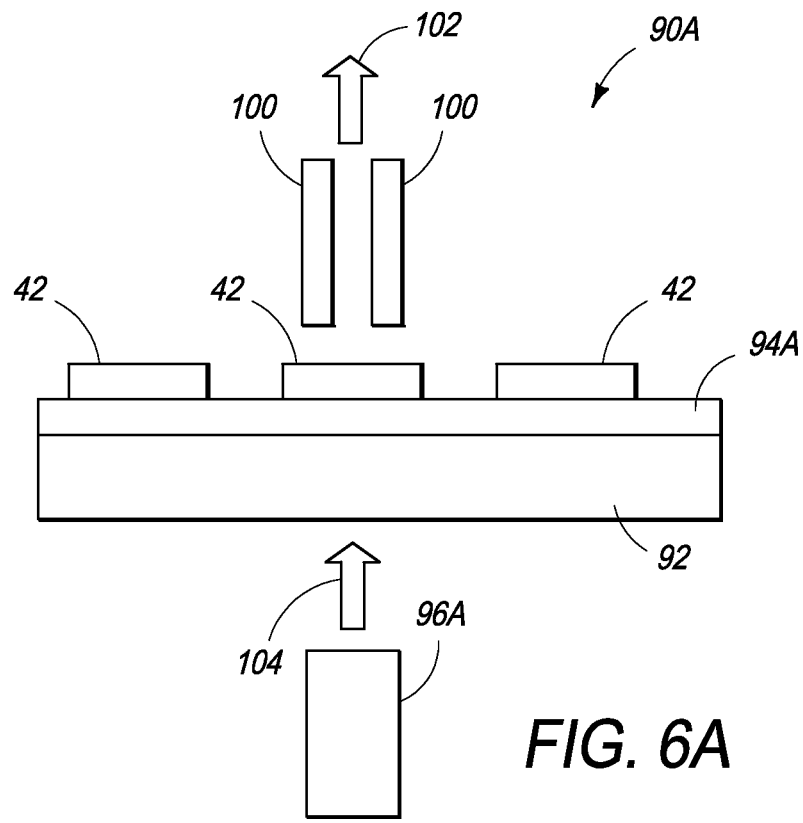
FIGS. 6A and 6B are schematic cross sectional views illustrating a pick and place mechanism and a UV curing apparatus of the system.
Figure 6B:
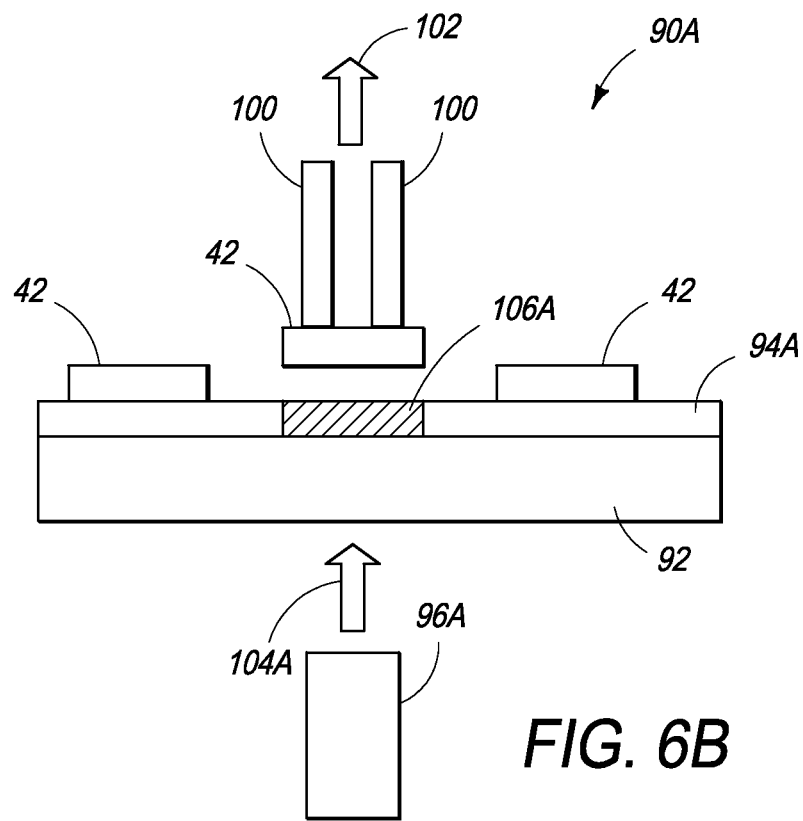

Referring to FIGS. 6A and 6B, a system 90A includes an adhesive layer 94A configured to have reduced adhesiveness upon exposure to ultraviolet radiation. The system 90A includes a curing apparatus 96A configured to focus ultraviolet radiation 104A on a selected area 106A of the adhesive layer 94A. As shown in FIG. 6B, the selected area 106A of reduced adhesiveness has a peripheral shape corresponding to the peripheral shape of the wavelength conversion layer 42. The system 90A also includes a capillary 100 in flow communication with a vacuum 102 configured to pick the wavelength conversion layer 42 from the substrate 92 and to place the wavelength conversion layer 42 on the die 30 (or 60).

Figure 7A:
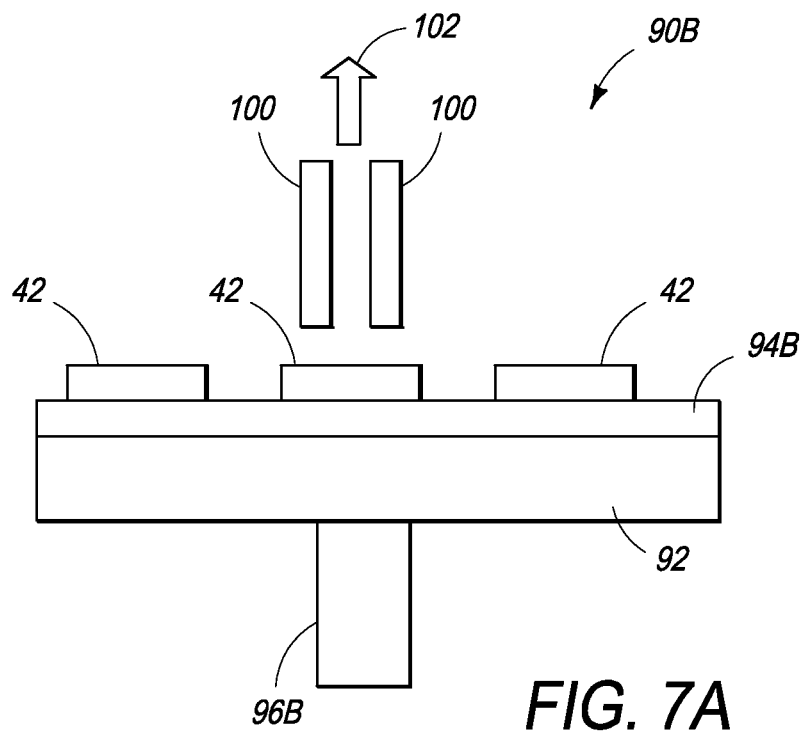
FIGS. 7A and 7B are schematic cross sectional views illustrating a pick and place mechanism and a heat curing apparatus of the system.
Figure 7B:
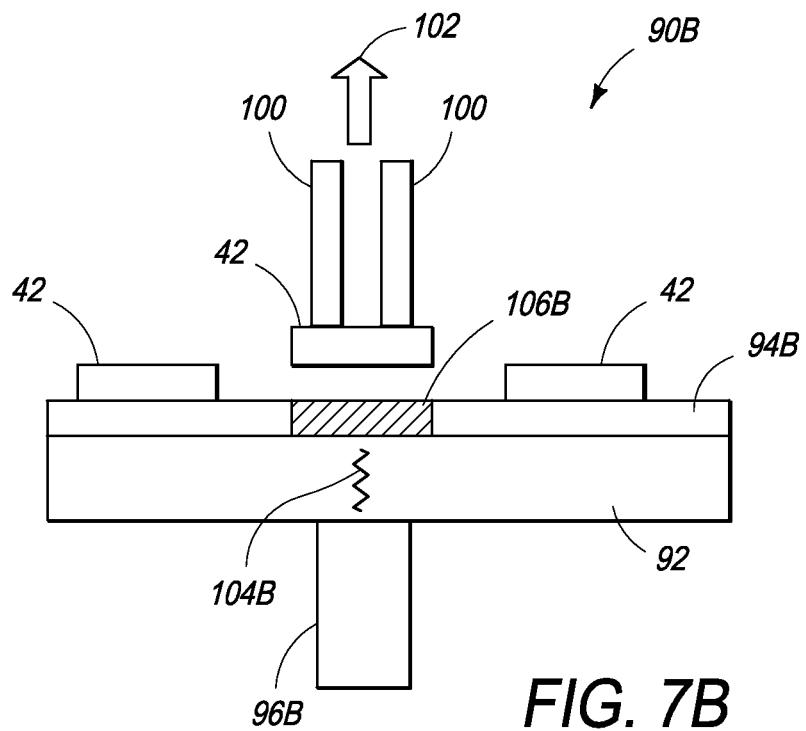

Referring to FIGS. 7A and 7B, a system 90B includes an energy sensitive adhesive layer 94B configured to have reduced adhesiveness upon exposure to heat. The system 90B includes a hot bar curing apparatus 96B configured to direct heat 104B for heating up a selected area 106B of the adhesive layer 94B. As shown in FIG. 6B, the selected area 106B of reduced adhesiveness has a peripheral shape corresponding to the peripheral shape of the wavelength conversion layer 42. The system 90B also includes a capillary 100 in flow communication with a vacuum 102 configured to pick the wavelength conversion layer 42 from the substrate 92 and to place the wavelength conversion layer 42 on the die 30 (or 60).

Thus the disclosure describes an improved system and method for fabricating light emitting diode (LED) dice having wavelength conversion layers. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A system for fabricating light emitting diode (LED) dice comprising:
    a light emitting diode (LED) die;
    a plurality of wavelength conversion layers configured for attachment to the light emitting diode (LED) die contained on a substrate on an adhesive layer configured to have reduced adhesiveness upon exposure to a physical energy;
    a curing apparatus configured to reduce the adhesiveness of the adhesive layer to facilitate removal of the wavelength conversion layers from the substrate; and
    an attachment apparatus configured to remove the wavelength conversion layers one at a time from the substrate and to attach the wavelength conversion layers to the light emitting diode (LED) die.

2. The system of claim 1 wherein the each wavelength conversion layer has a first peripheral shape which substantially matches a second peripheral shape of an area on the light emitting diode (LED) die.

3. The system of claim 1 wherein the each wavelength conversion layer includes one or more features that align with one or more corresponding features on the light emitting diode (LED) die.

4. The system of claim 1 wherein the physical energy comprises ultraviolet radiation and the curing apparatus comprises an ultraviolet radiation curing apparatus.

5. The system of claim 1 wherein the physical energy comprises heat and the curing apparatus comprises a hot bar curing apparatus.

6. A system for fabricating light emitting diode (LED) dice comprising:
    a light emitting diode (LED) die;
    a plurality of wavelength conversion layers on a substrate on an adhesive layer configured to have reduced adhesiveness upon exposure to an electromagnetic radiation, each wavelength conversion layer configured for attachment to the light emitting diode (LED) die and having a first peripheral shape;
    a curing apparatus configured to apply a physical energy on the adhesive layer in a selected area thereof to reduce the adhesiveness of the adhesive layer, the selected area having a second peripheral shape corresponding to the first peripheral shape; and
    an attachment apparatus configured to remove the wavelength conversion layers one at a time from the substrate and to attach the wavelength conversion layers to the light emitting diode (LED) die.

7. The system of claim 6 wherein the physical energy comprises a radiation selected from the group consisting of as ultraviolet, infrared, radioactive and heat.

8. The system of claim 6 wherein each wavelength conversion layer includes a feature selected from the group consisting of cut outs, openings and slots.

9. The system of claim 6 wherein the physical energy comprises ultraviolet radiation and the curing apparatus comprises an ultraviolet radiation curing apparatus.

10. The system of claim 6 wherein the physical energy comprises heat and the curing apparatus comprises a hot bar curing apparatus.

11. The system of claim 6 wherein the wavelength conversion layers comprise a base material and a phosphor compound incorporated into the base material.

12. The system of claim 6 wherein the wavelength conversion layers comprise a base material and a phosphor compound deposited on the base material.

13. The system of claim 6 wherein the light emitting diode (LED) die comprises a vertical light emitting diode (VLED) die.

14. The system of claim 6 wherein the light emitting diode (LED) die comprises a planar light emitting diode (PLED) die.

* * * * *